US010570322B2

(12) United States Patent
Ashitaka et al.

(10) Patent No.: US 10,570,322 B2
(45) Date of Patent: Feb. 25, 2020

(54) POLISHING COMPOSITION

(71) Applicant: FUJIMI INCORPORATED, Kiyosu-shi, Aichi (JP)

(72) Inventors: Keiji Ashitaka, Kiyosu (JP); Shogo Tsubota, Kiyosu (JP)

(73) Assignee: FUJIMI INCORPORATED, Aichi (JP)

( * ) Notice: Subject to any disclaimer, the term of this patent is extended or adjusted under 35 U.S.C. 154(b) by 0 days.

(21) Appl. No.: 16/245,030

(22) Filed: Jan. 10, 2019

(65) Prior Publication Data

US 2019/0144728 A1 May 16, 2019

Related U.S. Application Data

(62) Division of application No. 15/544,425, filed as application No. PCT/JP2016/051440 on Jan. 19, 2016.

(30) Foreign Application Priority Data

Jan. 19, 2015 (JP) ................................ 2015-008052

(51) Int. Cl.
*C09K 3/14* (2006.01)
*C09G 1/02* (2006.01)
*B24B 37/04* (2012.01)
*H01L 21/3105* (2006.01)

(52) U.S. Cl.
CPC .......... *C09K 3/1463* (2013.01); *B24B 37/044* (2013.01); *C09G 1/02* (2013.01); *C09K 3/1436* (2013.01); *H01L 21/31053* (2013.01)

(58) Field of Classification Search
CPC .......... C09K 3/14; C09K 3/1463; C09G 1/02; B24B 37/044
See application file for complete search history.

(56) References Cited

U.S. PATENT DOCUMENTS 4,842,837 A ‡ 6/1989 Shimizu ................. B82Y 30/00 423/33
2004/0127147 A1 ‡ 7/2004 Suenaga .................. C09G 1/02 451/36
2010/0181525 A1 ‡ 7/2010 Belmont ................ B82Y 30/00 252/79
2013/0146804 A1 ‡ 6/2013 Mizuno .................... C09G 1/02 252/79
2013/0158009 A1 ‡ 6/2013 Aicher ................. C07D 401/14 514/21
2014/0251950 A1 ‡ 9/2014 Yoshizki .............. C09K 3/1445 216/38
2014/0308155 A1 ‡ 10/2014 Morinaga ............... B24B 29/00 420/43
2014/0349484 A1 ‡ 11/2014 Yokota ................ H01L 21/3212 438/693
2016/0293436 A1 * 10/2016 Yokota ..................... C09G 1/02
2017/0342304 A1 11/2017 Ashitaka et al.
2017/0362465 A1 12/2017 Ashitaka et al.
2019/0144728 A1 5/2019 Ashitaka et al.

FOREIGN PATENT DOCUMENTS

CN 1513931 A ‡ 7/2004
CN 103180101 A ‡ 6/2013
GB 2 397 068 ‡ 7/2004 .............. C09K 3/14
JP S63-074911 A 4/1988
JP 10-204052 A ‡ 8/1998
JP 2004-204151 A 7/2004
JP 2005-060217 A 3/2005
JP 2005-162533 A ‡ 6/2005
JP 2009-172709 A 8/2009
JP 2010-269985 A 12/2010
JP 2012-040671 A 3/2012
JP 2013-041992 A 2/2013
WO WO 2014/077104 * 5/2014 .............. C09K 3/14

OTHER PUBLICATIONS

Fierro et al. "Sulfonic acid-functionalized silica through quantitative oxidation of thiol groups", Chem. Commun., 2003, published in Dec. 2002, pp. 246-247.*

Oh et al.; "Synthesis of Super-hydrophilic Mesoporous Silica via a Sulfonation Route", J. Ind. Eng. Chem., vol. 12, No. 6, (2006), pp. 911-917.‡

Taikei, G., "CMP Technology Compendium: A Library of CMP Planarization Technology and Application," CMP, 2006, Japan, 6 pages.‡

Non-Final Office Action on U.S. Appl. No. 15/544,425 dated Jan. 24, 2019.

Oh et al., "Synthesis of Super-hydrophilic Mesoporous Silica via a Sulfonation Route", J. Ind. Eng. Chem., 2006, 12(6):911-917.

Chinese Office Action issued in application No. 201680006419.5 dated Jul. 3, 2018.

Office Action received in corresponding Chinese Patent Application No. 201680006419.5, dated May 7, 2019.

Extended European Search Report Issued on Application No. 16740167.8, dated Dec. 20, 2017.

(Continued)

*Primary Examiner* — Pegah Parvini

(74) *Attorney, Agent, or Firm* — Foley & Lardner LLP

(57) ABSTRACT

Disclosed herein is a polishing composition comprising a pH of 6 or less, sulfonic acid-modified colloidal silica obtained by immobilizing sulfonic acid on surfaces of silica particles, and water, wherein the sulfonic acid-modified colloidal silica is derived from sulfonic acid-modified aqueous anionic silica sol produced by a production method comprising: a first reaction step of obtaining a reactant by heating raw colloidal silica having a number distribution ratio of 10% or less of microparticles having a particle diameter of 40% or less relative to a volume average particle diameter based on Heywood diameter (equivalent circle diameter) as determined by image analysis using a scanning electron microscope in the presence of a silane coupling agent having a functional group chemically convertible to a sulfonic acid group; and a second reaction step of converting the functional group to a sulfonic acid group by treating the reactant.

24 Claims, 3 Drawing Sheets

(56) References Cited

OTHER PUBLICATIONS

Office Action issued on Japanese Application No. 2016-570654, dated Oct. 1, 2019.
Office Action issued on Japanese Application No. 2016-570655, dated Jul. 2, 2019.
Non-Final Office Action on U.S. Appl. No. 15/544,389 dated Sep. 18, 2019.
Office Action Issued on Taiwanese Application No. 105101552, dated Mar. 27, 2019.
Office Action issued on Taiwanese Application No. 105101552 dated Sep. 3, 2019.
Taiwanese Office Action issued on Application No. 108122957, dated Oct. 1, 2019.
Taiwanese Office Action issued on Application No. 105101553, dated Dec. 12, 2019.

* cited by examiner
‡ imported from a related application

POLISHING COMPOSITION

CROSS-REFERENCE TO RELATED APPLICATIONS

The present application is a divisional of U.S. application Ser. No. 15/544,425 filed Jul. 18, 2017, which is a U.S. National Stage Application of PCT/JP2016/051440 filed Jan. 19, 2016, which claims the benefit of priority from Japanese Patent Application No. 2015-008052 filed Jan. 19, 2015; the entire contents of all of which are incorporated herein by reference.

TECHNICAL FIELD

The present invention relates to a polishing composition.

BACKGROUND ART

In a semiconductor device production process, as the performance of a semiconductor device is improved, techniques for producing the wiring with higher density and higher integration are required. In a production process of such a semiconductor device, chemical mechanical polishing (CMP) is an essential process. As the miniaturization of the semiconductor circuit progresses, it is demanded to realize the high flatness required for the unevenness of a pattern wafer and also to realize the high smoothness of nano order by CMP. In order to realize the high smoothness by CMP, it is preferred that the convex portion of the pattern wafer is polished at a high polishing rate but the concave portion is not polished so much.

Herein, in a case of using a pattern wafer made of a silicon nitride film (SiN film), since the silicon nitride film usually has unevenness, when polishing such a material, not only the convex portions but also the concave portions are scraped together, and the unevenness are hardly sufficiently eliminated.

In addition, the semiconductor wafer is constituted of dissimilar materials including polycrystalline silicon forming a circuit, silicon oxide being an insulating material, and silicon nitride for protecting a silicon dioxide surface that is not part of the trench or the via from the damages during etching. Therefore, a phenomenon such as dishing, in which a material that is relatively soft and easily reacts with a polishing agent, such as polycrystalline silicon, and silicon oxide is scraped excessively as compared with the silicon nitride or the like surrounding the material, is generated, and unevenness is left.

From these things, in a polishing process of a pattern wafer made of a hard and chemically stable material such as silicon nitride, it is required to sufficiently eliminate the unevenness.

As a technique to respond to the requirement, for example, in JP 2012-040671 A, for the purpose of providing a polishing composition capable of polishing at a high speed an object to be polished that is poor in chemical reactivity, such as silicon nitride, a technique in which colloidal silica which is immobilized with an organic acid (sulfonic acid-modified aqueous anionic silica sol) is allowed to be contained in the composition as abrasive grains, and the pH is adjusted to 6 or less has been disclosed.

Herein, in general, there is a problem that silica sol such as colloidal silica is unstable because silica particles aggregate with each other under an acidic condition. As a technique to solve such a stability problem, in JP 2010-269985 A, sulfonic acid-modified aqueous anionic sol having a zeta potential of −15 mV or less at an acidic of pH 2 or more has been disclosed. In addition, in JP 2010-269985 A, as a method for producing the anionic sol described above, a technique in which a silane coupling agent having a functional group chemically convertible to a sulfonic acid group (for example, a mercapto group) is added to colloidal silica, and then the functional group is converted to a sulfonic acid group has been disclosed. Herein, in Examples of JP 2010-269985 A, silica sol containing water and methanol as a dispersing medium is heated and concentrated under alkaline and normal pressure conditions, and then into the silica sol, a mercapto group-containing silane coupling agent (3-mercaptopropyl trimethoxysilane) is added, and the resultant mixture is refluxed at a boiling point and heat aged. Next, methanol and ammonia are replaced with water, and the resultant mixture is cooled down to room temperature at the time point when the pH becomes 8 or less, and into the cooled mixture, hydrogen peroxide water is added, the mercapto group is converted to a sulfonic acid group by heating the mixture, as a result, anionic silica sol of which the surface has been modified with a sulfonic acid group is obtained.

In addition, in JP 2013-41992 A, there is a disclosure about the production of similar sulfonic acid-modified aqueous anionic silica sol, referring to the above-described JP 2010-269985A, and J. Ind. Eng. Chem., Vol. 12, No. 6 (2006) 911-917. Herein, in Examples of JP 2013-41992 A, into an aqueous solution of the mercapto group-containing silane coupling agent similar to that as described above (under an acidic condition with acetic acid), silica sol containing water as a dispersing medium is added, the resultant mixture is stirred at room temperature for one hour, and then into the mixture hydrogen peroxide water is added, and the resultant mixture is left to stand at room temperature for 48 hours, as a result, sulfonic acid-modified aqueous anionic silica sol is obtained.

SUMMARY OF INVENTION

In performing the technique described in JP 2012-040671 A, the present inventors tried to use the sulfonic acid-modified aqueous anionic silica sol produced by the method described in JP 2010-269985 A and JP 2013-41992 A. As a result, it was found that there is a problem that when a SiN wafer is polished by using a polishing composition containing anionic silica sol that has been produced by using the techniques described in these conventional arts, the ratio of the polishing rate of SiN to tetraethyl orthosilicate (TEOS) or polycrystalline silicon (poly-Si) fluctuates with time.

Accordingly, an object of the present invention is to provide a technique in which the stability of the SiN polishing rate with time can be improved in a case where the polishing composition is used as a polishing composition for polishing an object to be polished that contains SiN, in a polishing composition containing sulfonic acid-modified aqueous anionic sol.

To solve the problem described above, the present inventors carried out intensive studies. As a result, it was found that in the method for producing sulfonic acid-modified aqueous anionic silica sol, which is described in JP 2010-269985 A, by adding a silane coupling agent into silica sol after the reduction of the amount of the fine silica particles contained in the silica sol before the addition of a silane coupling agent, performing a reaction in the similar manner, and subsequently, performing an oxidation step, sulfonic acid-modified aqueous anionic silica sol that can solve the above-described problem is obtained. Based on the above findings, the present inventors thus have completed the present invention.

That is, according to an embodiment of the present invention, a polishing composition having a pH of 6 or less is provided. The polishing composition contains sulfonic acid-modified colloidal silica obtained by immobilizing sulfonic acid on surfaces of silica particles, and water. Further, the sulfonic acid-modified colloidal silica is characterized by being derived from the sulfonic acid-modified aqueous anionic silica sol produced by a production method including a first reaction step of obtaining a reactant by heating raw colloidal silica having a number distribution ratio of 10% or less of microparticles having a particle diameter of 40% or less relative to a volume average particle diameter based on Heywood diameter (equivalent circle diameter) as determined by image analysis using a scanning electron microscope in the presence of a silane coupling agent having a functional group chemically convertible to a sulfonic acid group, and a second reaction step of converting the functional group to a sulfonic acid group by treating the reactant.

According to the present invention, in a polishing composition containing sulfonic acid-modified aqueous anionic sol, a technique in which the stability of the SiN polishing rate with time can be improved in a case where the polishing composition is used as a polishing composition for polishing an object to be polished that contains SiN can be provided.

DESCRIPTION OF EMBODIMENTS

Figure 1:
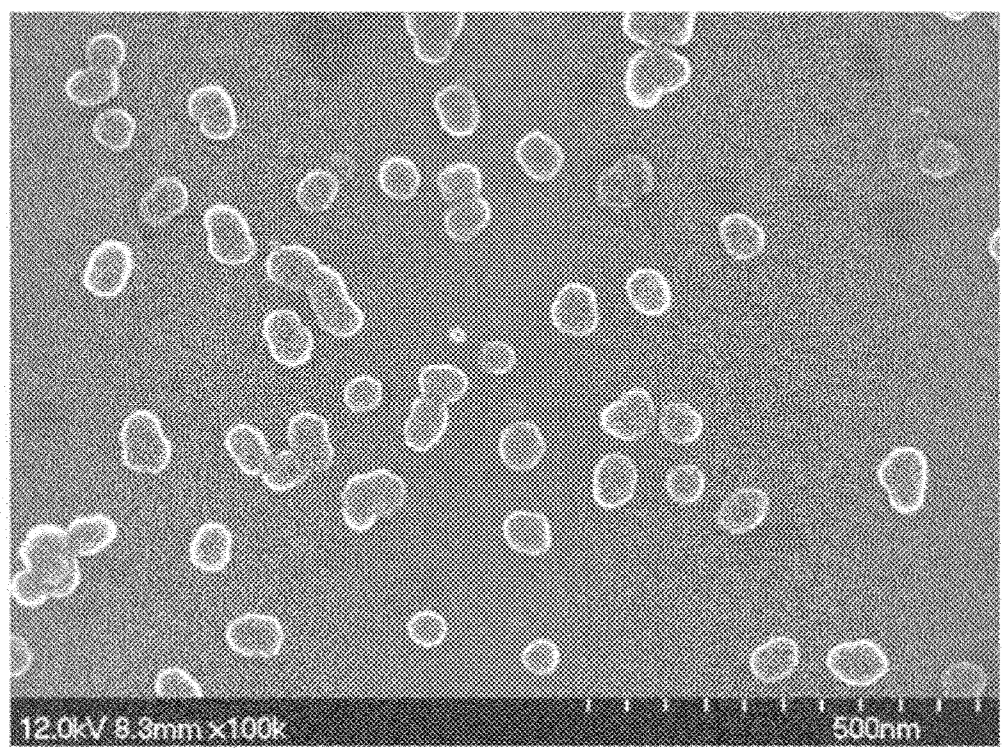
FIG. 1 is a photograph of sulfonic acid-modified aqueous anionic silica sol obtained in Example 1, observed with a scanning electron microscope (SEM) (magnification: 100000 times).

Hereinafter, the embodiment for carrying out the present invention will be described in detail.

An embodiment of the present invention is a polishing composition having a pH of 6 or less, containing sulfonic acid-modified colloidal silica obtained by immobilizing sulfonic acid on surfaces of silica particles, and water, wherein the sulfonic acid-modified colloidal silica is derived from sulfonic acid-modified aqueous anionic silica sol produced by a production method including a first reaction step of obtaining a reactant by heating raw colloidal silica having a number distribution ratio of 10% or less of microparticles having a particle diameter of 40% or less relative to a volume average particle diameter based on Heywood diameter (equivalent circle diameter) as determined by image analysis using a scanning electron microscope in the presence of a silane coupling agent having a functional group chemically convertible to a sulfonic acid group, and a second reaction step of converting the functional group to a sulfonic acid group by treating the reactant.

The polishing composition according to the present embodiment is prepared by mixing in water the sulfonic acid-modified colloidal silica (abrasive grains) obtained by immobilizing sulfonic acid on surfaces of silica particles, and by adjusting the pH. The polishing composition is preferably used mainly for an application of polishing silicon nitride, and more specifically, the polishing composition is more preferably used mainly for an application of polishing the surface containing silicon nitride in an object to be polished such as a semiconductor wiring substrate.

[Sulfonic Acid-modified Colloidal Silica (Abrasive Grains)]

In the polishing composition according to the present embodiment, it is characterized in that the sulfonic acid-modified colloidal silica (abrasive grains) contained in the composition is derived from a sulfonic acid-modified aqueous anionic silica sol produced by a specific production method. Hereinafter, the production method for producing the sulfonic acid-modified colloidal silica to be contained in the polishing composition according to the present embodiment will be described in detail.

(First Reaction Step)

In the first reaction step, the raw colloidal silica is heated in the presence of a silane coupling agent having a functional group chemically convertible to a sulfonic acid group. As a result, a reactant (in which a silane coupling agent having a functional group chemically convertible to a sulfonic acid group is bonded to surfaces of silica particles) can be obtained.

The raw colloidal silica used in the first reaction step is not particularly limited as long as having a silanol group on the surface. However, it is preferred not to contain diffusible metal impurities and corrosive ions such as chlorine in a semiconductor, therefore, in consideration of this point, it is preferred that a hydrolyzable silicon compound (for example, an alkoxysilane or a derivative thereof) is used as a starting material, and the colloidal silica obtained by hydrolysis and condensation is used as the raw colloidal silica. The silicon compound may be used singly alone, or may also be used in combination of two or more kinds thereof.

In an embodiment, the silicon compound is preferably an alkoxysilane represented by the following general formula (1) or a derivative thereof.

$$Si(OR)_4 \quad (1)$$

In the general formula (1), R is an alkyl group, preferably a lower alkyl group having 1 to 8 carbon atoms, and more preferably a lower alkyl group having 1 to 4 carbon atoms. Herein, examples of the R include a methyl group, an ethyl group, a propyl group, an isopropyl group, a butyl group, a pentyl group, and a hexyl group, and tetramethoxysilane in which R is a methyl group, tetraethoxysilane in which R is an ethyl group, and tetraisopropoxysilane in which R is an isopropyl group are preferred. Further, as the derivative of the alkoxysilane, a low condensate obtained by partially hydrolyzing the alkoxysilane is mentioned. In the present invention, it is preferred to use tetramethoxysilane from the point that it is easy to control the hydrolysis rate, the point that fine silica particles of single-digit nm can be easily obtained, and the point that unreacted residues are less.

The silicon compound is hydrolyzed and condensed in a reaction solvent, and becomes colloidal silica. As the reaction solvent, water or an organic solvent containing water can be used. Examples of the organic solvent include a hydrophilic organic solvent including alcohols such as methanol, ethanol, isopropanol, n-butanol, t-butanol, pentanol, ethylene glycol, propylene glycol, and 1,4-butanediol; ketones such as acetone and methyl ethyl ketone; and the like. Among these organic solvents, it is preferred to use particularly alcohols such as methanol, ethanol, and isopropanol, and from the viewpoint of the post-processing of the reaction solvent, and the like, it is more preferred to use alcohols having the same alkyl group as the alkyl group (R) of the starting material silicon compound (for example, methanol to tetramethoxysilane). These organic solvents may be used singly alone, or may also be used in combination of two or more kinds thereof. The use amount of the organic solvent is not particularly limited, but is preferably around 5 to 50 mol per 1 mol of the silicon compound. When the use amount is 5 mol or more, the sufficient compatibility with the silicon compound is ensured, and when the use amount is 50 mol or less, the decrease in the production efficiency is suppressed. The amount of the water to be added into the organic solvent is not particularly limited, as long as the amount required for the hydrolysis of the silicon compound is present, and around 2 to 15 mol per 1 mol of the silicon compound is preferred. In addition, the amount of the water to be mixed in the organic solvent largely affects the particle diameter of the colloidal silica to be formed. By increasing the addition amount of water, the particle diameter of the colloidal silica can be increased. Further, by decreasing the addition amount of water, the particle diameter of the colloidal silica can be reduced. Accordingly, by changing the mixing ratio of the water and the organic solvent, the particle diameter of the colloidal silica to be produced can be arbitrarily adjusted.

It is preferred to adjust the reaction solvent to alkaline by adding a basic catalyst to the reaction solvent of the hydrolysis condensation reaction of the silicon compound to obtain colloidal silica (Stober method). Accordingly, the reaction solvent is adjusted to preferably pH 8 to 11, and more preferably to pH 8.5 to 10.5, and the colloidal silica can be rapidly formed. As the basic catalyst, organic amine and ammonia are preferred from the viewpoint of preventing the contamination of impurities, in particular, ethylenediamine, diethylenetriamine, triethylenetetramine, ammonia, urea, ethanol amine, tetramethylammonium hydroxide, and the like can be preferably mentioned.

In order to hydrolyze and condense the silicon compound in the reaction solvent, the silicon compound that is a starting material is added to an organic solvent, and the resultant mixture is stirred at a temperature condition of 0 to 100° C., and preferably 0 to 50° C. By hydrolyzing and condensing the silicon compound while stirring the silicon compound in an organic solvent containing water, colloidal silica having a spherical shape and a uniform particle diameter can be obtained.

In also the first reaction step of the production method according to the present embodiment, to the raw colloidal silica obtained by the technique mentioned above, "a silane coupling agent having a functional group chemically convertible to a sulfonic acid group" is added, in the similar manner as in the technique described in JP 2010-269985 A. Here, in the point that the amount of the microparticles contained in the raw colloidal silica has been reduced, an improvement against the technique described in JP 2010-269985 A has been performed. Specifically, the raw colloidal silica used in the first reaction step of the production method according to the present embodiment is characterized in the point that a number distribution ratio of microparticles having a particle diameter of 40% or less relative to a volume average particle diameter (hereinafter, also simply referred to as "microparticles") based on Heywood diameter (equivalent circle diameter) as determined by image analysis using a scanning electron microscope is 10% or less. The number distribution ratio is preferably 5% or less, more preferably 2% or less, furthermore preferably 1% or less, still more preferably 0.5% or less, particularly preferably 0.3% or less, and most preferably 0.2% or less. From the viewpoint of obtaining action effects of the present invention, the smaller the number distribution ratio of the microparticles is, the more preferred it is, therefore, the lower limit value of the number distribution ratio is not particularly limited, but is, for example, 0.001% or more. In addition, the method for measuring the number distribution ratio is performed in accordance with the description in Examples described later.

There is no particular limitation on the specific technique for setting the number distribution ratio of the microparticles contained in the raw colloidal silica to 10% or less, and conventionally known knowledge can be appropriately referred. As an example of such a technique, in a case where the concentration of the organic solvent in the colloidal silica obtained by the above-described hydrolysis and condensation reaction is 1% by mass or more, a method for removing the organic solvent coexisting with the colloidal silica can be mentioned so that the residual organic solvent concentration in the colloidal silica becomes less than 1% by mass. Herein, the expression "whether or not the residual organic solvent concentration in the colloidal silica is less than 1% by mass" is synonymous with the expression "whether or not the organic solvent is detected in the colloidal silica" in the method for measuring the organic solvent concentration (methanol concentration in Examples) using the gas chromatography that is described in Examples described later. That is, the above-described expression "so that the residual organic solvent concentration in the colloidal silica becomes less than 1% by mass" can also be paraphrased as the expression "so that the organic solvent in the colloidal silica measured by the measurement method using the gas chromatography that is described in the Examples, becomes lower than the detection limit".

As described above, by decreasing the concentration of the organic solvent contained in the colloidal silica, the amount of the microparticles contained in the raw colloidal silica can be decreased. At this time, as the amount of the organic solvent contained in the colloidal silica is decreased, the amount of the microparticles contained in the raw colloidal silica can be decreased. In addition, the organic solvent concentration in the colloidal silica obtained by the above-described Stober method usually exceeds 1% by mass. Accordingly, in an embodiment of the production method according to the present invention, a step in which an organic solvent is removed so that the residual organic solvent concentration in colloidal silica becomes 1% by mass or less after the colloidal silica is obtained by a Stober method is further included.

As the technique for removing the organic solvent coexisting with the colloidal silica, a method in which a dispersion (silica sol) of colloidal silica is heated and the organic solvent is distilled off can be mentioned. At this time, by replacing the organic solvent to be removed with water, the liquid amount of the colloidal silica dispersion can be maintained. In addition, the pH of the colloidal silica dispersion at the time of distilling off the organic solvent is preferably pH 7 or more. As a result, there is an advantage that together with the distillation of the organic solvent, the microparticles can also be incorporated on surfaces of the main particles of colloidal silica by Ostwald ripening, and the amount of the microparticles can further be decreased.

In addition, in the above description, as the technique for setting the number distribution ratio of the microparticles contained in the raw colloidal silica to 10% or less, a method for removing the organic solvent coexisting with the colloidal silica has been explained in detail as an example, but by a technique different from this, the number distribution ratio of the microparticles contained in the raw colloidal silica may be set to 10% or less. As such a technique, for example, a technique of using oligomers as a starting material, a technique of optimizing the composition at the time of synthesis, a technique of performing a high temperature and pressure treatment after synthesis, a technique of performing centrifugation after synthesis, and the like can be mentioned, and a technique other than these techniques may also be used of course.

As needed, before the first reaction step, various treatment steps may be applied to the raw colloidal silica obtained in the above. As such a treatment step, for example, a step of lowering the viscosity of the raw colloidal silica can be mentioned. As the step of lowering the viscosity of the raw colloidal silica, for example, a step of adding an alkaline solution (aqueous solution of various bases, such as ammonia water) or an organic solvent to the raw colloidal silica can be mentioned. The amount of the alkaline solution or organic solvent to be added at this time is not particularly limited, and may be appropriately set in consideration of the viscosity of the raw colloidal silica to be obtained after the addition. As described above, by performing the step of lowering the viscosity of the raw colloidal silica, there is an advantage that the initial dispersibility of a coupling agent to colloidal silica is improved and the aggregation of silica particles can be suppressed.

In the first reaction step, as described above, the raw colloidal silica having a small content of microparticles is heated in the presence of a silane coupling agent having a functional group chemically convertible to a sulfonic acid group. As a result, a reactant can be obtained. The reason why the silane coupling agent having a functional group different from a sulfonic acid group is reacted with the raw colloidal silica, and then the functional group is converted to a sulfonic acid group (the second reaction step described later) is because in general, it is difficult to stably obtain a silane coupling agent in a form of being replaced with sulfonic acid groups.

As the silane coupling agent having a functional group chemically convertible to a sulfonic acid group, for example, 1) a silane coupling agent having a sulfonic acid ester group convertible to a sulfonic acid group by hydrolysis, and 2) a silane coupling agent having a mercapto group and/or a sulfide group convertible to a sulfonic acid group by oxidation can be mentioned. In addition, since the sulfonic acid modification on the colloidal silica surface is performed in a solution, in order to increase the modification efficiency, it is preferred to use the latter coupling agent having a mercapto group and/or a sulfide group.

Examples of the silane coupling agent having a mercapto group include 3-mercaptopropyl trimethoxysilane, 2-mercaptopropyl triethoxysilane, 2-mercaptoethyl trimethoxysilane, and 2-mercaptoethyl triethoxysilane. Further, as the coupling agent having a sulfide group, for example, bis(3-triethoxysilylpropyl)disulfide, or the like can be mentioned.

Further, the silane coupling agent is hydrolyzed in advance with an acid, and then the condensation reaction to the raw colloidal silica may also be performed.

As described above, as the technique for setting the number distribution ratio of the microparticles contained in the raw colloidal silica to 10% or less, in a case of employing a method for removing the organic solvent coexisting with colloidal silica, the raw colloidal silica substantially does not contain the organic solvent, and the dispersing medium of the raw colloidal silica is substantially composed of water. On the other hand, since the silane coupling agent is hardly dissolved in water, for the purpose of dissolving the silane coupling agent, a certain amount or more of an organic solvent (hydrophilic solvent) is preferably used. As such an organic solvent (hydrophilic solvent), for example, the above-described organic solvents such as methanol, ethanol, and isopropanol can be mentioned. Among them, it is preferred to use the same kind of alcohol as the alcohol produced by the above-described hydrolysis of silicon compound. This is because the recovery and reuse of the solvent can be facilitated by using the same kind of alcohol as the alcohol produced by the hydrolysis of silicon compound. Further, such an organic solvent (hydrophilic solvent) may be added to the raw colloidal silica, or the silane coupling agent is mixed in advance with the organic solvent (hydrophilic solvent) to obtain a mixture, and the mixture may be added to the raw colloidal silica. The latter method is more preferred. In addition, in JP 2010-269985 A, there is a description of "Considering the solubility of the coupling agent, it is preferred that the colloidal silica contains a hydrophilic organic solvent. In this regard, in a case where colloidal silica is obtained by a Stober method in which an alkoxysilane is hydrolyzed and condensed in an alcohol-water solvent with a basic catalyst, alcohol is contained in the reaction mixture, therefore, it is not required to further add a hydrophilic organic solvent." However, in the preferred embodiment of the present invention, a seemingly roundabout configuration in which the amount of the organic solvent contained in the raw colloidal silica obtained by a Stober method is once decreased to lower than the detection limit, and then the silane coupling agent is added is employed. According to the preferred embodiment of the present invention, even if the roundabout configuration as described above is employed, it has been found that the problem according to the present invention can be solved. Therefore, it can be said that the present invention, in which it has been found that the action effects that is considered to be unpredictable by those skilled in the art are exerted in spite of employing the configuration contrary to the conventional technical common sense as described above, is not an invention that could have been easily made by those skilled in the art who had been in contact with the description of particularly JP 2010-269985 A. Further, in the point that the sulfonic acid-modified aqueous anionic silica sol from which the sulfonic acid-modified colloidal silica contained in the polishing composition according to the present invention is derived is anionic silica sol in which the surfaces of silica particles have been modified with a sulfonic acid group, the technique is the same as that described in JP 2010-269985 A. However, it is apparent also from the experimental results described in a section of Examples described later that due to the different production method, the structure of the obtained product (sulfonic acid-modified aqueous anionic silica sol) is different. However, from the analytical limit, from the viewpoint of the structure of the obtained product (sulfonic acid-modified aqueous anionic silica sol), it cannot specify the sulfonic acid-modified aqueous anionic silica sol according to the present invention and the sulfonic acid-modified colloidal silica derived therefrom in distinction from those described in JP 2010-269985 A.

In addition, the addition amount of the silane coupling agent used in the first reaction step is not particularly limited, but is, based on 100% by mass of the silica particles contained in the raw colloidal silica, preferably 0.5 to 10% by mass, more preferably 1 to 5% by mass, and furthermore preferably 1 to 3% by mass. When the addition amount of the silane coupling agent is 0.5% by mass or more, the surfaces of the silica particles can be sufficiently anionized, and an excellent performance can be exerted in a case of being used as a polishing agent (abrasive grains in a polishing composition). On the other hand, when the addition amount of the silane coupling agent is 10% by mass or less, gelation with time of the reactant (surface-modified silica sol) to be obtained can be prevented. Further, the amount of the organic solvent (hydrophilic solvent) used for dissolving the silane coupling agent is, based on 100% by mass of the silane coupling agent, preferably around 500 to 10000% by mass, and more preferably 1000 to 5000% by mass.

The temperature at which the silane coupling agent is added is not limited, but is preferably in the range of room temperature (around 20° C.) to the boiling point of the reaction solvent. The reaction time is not also limited, but is preferably 10 minutes to 10 hours, and more preferably 30 minutes to 2 hours. However, from the viewpoint of terminating the hydrolysis of the coupling agent, it is preferred that the first reaction step is performed under a condition that a temperature condition of 90° C. or more is continued for 30 minutes or more. The pH at the time of addition is also not limited, but is preferably 7 or more to 11 or less.

(Second Reaction Step)

In the second reaction step, the reactant (in which a silane coupling agent having a functional group chemically convertible to a sulfonic acid group is bonded to surfaces of silica particles), which has been obtained in the above-described first reaction step, is treated. As a result, the "functional group chemically convertible to a sulfonic acid group" possessed by the silane coupling agent is converted to a sulfonic acid group.

The specific form of the above-described "treatment" for converting the "functional group chemically convertible to a sulfonic acid group" possessed by the silane coupling agent to a sulfonic acid group is not particularly limited, and can be appropriately selected depending on the structure of the silane coupling agent to be used. For example, in the first reaction step, in a case where the above-described 1) a silane coupling agent having a sulfonic acid ester group convertible to a sulfonic acid group by hydrolysis is used, by subjecting the reactant to a hydrolysis treatment, the functional group (sulfonic acid ester group) possessed by the silane coupling agent can be hydrolyzed. As a result, the sulfonic acid ester group is converted to a sulfonic acid group.

Further, in the first reaction step, in a case where the above-described 2) a silane coupling agent having a mercapto group and/or a sulfide group convertible to a sulfonic acid group by oxidation is used, by subjecting the reactant to an oxidation treatment, the functional group (mercapto group and/or sulfide group) possessed by the silane coupling agent can be oxidized. As a result, the mercapto group or the sulfide group is converted to a sulfonic acid group.

In order to subject the reactant to an oxidation treatment, for example, the reactant may be reacted with an oxidizing agent. Examples of the oxidizing agent include nitric acid, hydrogen peroxide, oxygen, ozone, organic peracid (percarboxylic acid), bromine, hypochlorite, potassium permanganate, and chromic acid. Among these oxidizing agents, hydrogen peroxide and organic peracid (peracetic acid, and perbenzoic acids) are preferred in the point of being relatively easy to handle and being favorable in the oxidation yield. Further, in consideration of the substances by-produced in the reaction, it is most preferred to use hydrogen peroxide. From the viewpoint of ensuring the amount required for the reaction and decreasing the remaining oxidizing agent, the addition amount of the oxidizing agent is preferably 3 to 5 mol times the amount of the silane coupling agent. By setting the addition amount of the oxidizing agent to a value within such a range, the residual oxidizing agent concentration in the aqueous anionic silica sol to be obtained can be minimized. The specific numerical value of the residual oxidizing agent concentration in the aqueous anionic silica sol to be obtained is not particularly limited, but is preferably 1000 ppm by mass or less, more preferably 700 ppm by mass or less, and particularly preferably 500 ppm by mass or less. Herein, when a residual oxidizing agent concentration in the obtained aqueous anionic silica sol exceeds 1000 ppm by mass, in storing and transporting the anionic silica sol itself, or the polishing composition in which the silica sol have been added as abrasive grains, in a state of being enclosed in a sealed container, there may be a case where an oxidizing agent such as hydrogen peroxide is decomposed, gas such as oxygen is generated, and the internal pressure of the container increases. On the other hand, as described above, when a residual oxidizing agent concentration in the obtained aqueous anionic silica sol is reduced, the risk of such an increase of the internal pressure is reduced, therefore, this is preferred. Further, in a case of being used as a polishing composition, there is also an advantage that the occurrence of a problem such as wafer dishing, which can be generated when a large amount of oxidizing agent is contained, can be suppressed. In addition, as to the colloidal silica and the silane coupling agent, each of them has a structure that is stable in the oxidation reaction except for the functional groups to be oxidized (converted) to sulfonic acid groups, therefore, by-products are not present.

In a case where the sulfonic acid-modified aqueous anionic silica sol obtained according to the above-described method contains a solvent other than water, in order to improve the long-term storage stability of the silica sol, the dispersing medium mainly containing a reaction solvent may be replaced with water as needed. In addition, this water replacement may be performed after the addition of the silane coupling agent and before the addition of the oxidizing agent. The method for replacing the solvent other than water with water is not particularly limited, and for example, a method in which water is added dropwise by a fixed amount while heating the silica sol can be mentioned. Further, a method in which the silica sol is separated from the solvent other than water by precipitation and separation, centrifugation, or the like, and then redispersed in water can also be mentioned.

In the sulfonic acid-modified aqueous anionic silica sol obtained by the production method according to the present invention, a sulfonic acid group is immobilized on the surfaces of silica particles in the sol. In other words, the sulfonic acid-modified aqueous anionic silica sol is in a state in which an organic material having a sulfonic acid group at the terminal is bonded to the surfaces of silica particles in the sol. Accordingly, even in a case of using an acidic dispersing medium, aggregation and gelation of the silica sol are suppressed, and the dispersion can be stably performed for along time. For example, even under an acidic condition, aggregation or gelation is prevented for 2 weeks or more after the preparation. Therefore, even if the sulfonic acid-modified aqueous anionic silica sol is contained in the polishing composition (pH 6 or less) according to the present embodiment, the high stability can be exerted over a long period of time.

Further, in the sulfonic acid-modified aqueous anionic silica sol obtained by the production method according to the present invention, the content of microparticles including the silica particles of which surfaces are anionized is small. When expressing this qualitatively, the polishing composition according to another embodiment provided by the present invention is as follows: a polishing composition having a pH of 6 or less, and used for an application of polishing silicon nitride, containing sulfonic acid-modified colloidal silica obtained by immobilizing sulfonic acid on surfaces of silica particles, wherein the sulfonic acid-modified colloidal silica is derived from sulfonic acid-modified aqueous anionic silica sol in which when a SiN wafer is subjected to an immersion treatment under a pH 2 condition and then washed with pure water, the number of the particles having a particle diameter of less than 40% of a volume average particle diameter adhering to a surface of the SiN wafer is 50% or less relative to the number of the particles having a particle diameter of 40% or more of a volume average particle diameter adhering similarly. The proportion is preferably 30% or less, more preferably 10% or less, and furthermore preferably 5% or less. On the other hand, the lower limit value of this proportion is not particularly limited, but is, for example, 0.1% or more. Further, the measurement method of this proportion is as follows (described as "condition 8" also in a section of Examples).

(Adhesion Observation Test of SiN Wafer for Sulfonic Acid-Modified Aqueous Anionic Silica Sol)

Apparatus: Scanning electron microscope SU 8000 (manufactured by Hitachi High-Technologies Corporation)

Procedures: The obtained anionic modified colloidal silica is diluted to a silica concentration of 14% by mass and adjusted to pH 2 with a pH adjusting agent. A SiN wafer is immersed for 10 seconds, and then shaken in pure water for 30 seconds. Subsequently, the SiN wafer is dried thoroughly with $N_2$ gas, and then ten viewing fields are observed at a magnification of 100000 times using a scanning electron microscope SU 8000.

In addition, in the above-described adhesion observation test, since the interval between adhered particles differs depending on the particle diameter of silica particles, when the test is performed, the silica concentration in the colloidal silica can be arbitrarily changed so that the observation is easily performed, and this change has no effect on the measurement results.

Further, the sulfonic acid-modified aqueous anionic silica sol obtained by the production method according to the present invention, is preferred also in the point that the content of metal impurities is reduced. Herein, examples of the metal impurities include an alkali metal such as sodium, and potassium; an alkaline earth metal such as calcium, and magnesium; and a heavy metal or light metal such as aluminum, iron, titanium, nickel, chromium, copper, zinc, lead, silver, manganese, and cobalt. In the sulfonic acid-modified anionic silica sol according to the preferred embodiment of the present invention, the total content of the metal impurities is 1 ppm by mass or less. The total content is preferably 0.5 ppm by mass or less. In addition, the method for measuring the total content of the metal impurities is performed in accordance with the description in Examples described later. Further, the sulfonic acid-modified aqueous anionic silica sol is preferred because of containing no corrosive halogen element such as chlorine, and bromine.

The particle diameter of the silica particles contained in the sulfonic acid-modified aqueous anionic silica sol according to the present invention is not particularly limited, and is for example, 1000 nm or less, preferably 5 to 500 nm, and more preferably 10 to 300 nm. In addition, the particle diameter of the silica particles means the volume average particle diameter based on Heywood diameter (equivalent circle diameter) as measured by the technique described in Examples described later.

The sulfonic acid-modified aqueous anionic silica sol according to the present invention is excellent in the long-term dispersion stability in a wide pH range. The stability of the silica sol can be evaluated by measuring the zeta potential of the silica sol. The zeta potential is a potential difference generated at the interface between solid and liquid, which are in contact with each other, when the solid and the liquid are moved relatively to each other. As the absolute value of the zeta potential increases, the repulsion between the particles becomes stronger and the stability of the particles becomes higher, and as the absolute value of the zeta potential approaches zero, the particles tend to aggregate more easily.

In particular, the sulfonic acid-modified aqueous anionic silica sol according to the present invention has high stability in the acidic region. Since a coupling agent having an anionic group is used as a modifier, the zeta potential when the dispersing medium is acidic of pH 2 or more is negative potential (−15 mV or less), and even if the dispersing medium is acidic, the dispersion stability is high. As described above, since the absolute value of the zeta potential is large, the dispersion stability is high, and along with this, the kinematic viscosity of the silica sol is also small. Therefore, even if the sulfonic acid-modified aqueous anionic silica sol is contained in the polishing composition (pH 6 or less) according to the present embodiment, the high stability can be exerted over a long period of time.

The sulfonic acid-modified aqueous anionic silica sol according to the present invention can be stably dispersed for a long time in a wide pH range when being contained as abrasive grains in the polishing composition according to the present invention. As described above, when the sulfonic acid-modified aqueous anionic silica sol according to the present invention, in which the proportion of the microparticles adhering to a SiN wafer is kept low, is used particularly as a polishing agent for CMP polishing of a semiconductor wafer (SiN wafer), the fluctuation with time of the polishing rate can be minimized (excellent in the stability with time), therefore, the sulfonic acid-modified aqueous anionic silica sol is extremely suitably used for the applications, and can sufficiently cope also with the high performance requirements accompanying the miniaturization.

[Water]

The polishing composition of the present invention contains water as a dispersing medium or a solvent for dispersing or dissolving each component. From the viewpoint of suppressing the blocking of the action of other components, water containing impurities as little as possible is preferred, and specifically, pure water or ultrapure water in which impurity ions have been removed by an ion exchange resin and then foreign matters have been removed through a filter, or distilled water is preferred. As the "water", the water contained in the above-described sulfonic acid-modified aqueous anionic silica sol can be used as it is.

[pH Adjusting Agent]

The pH value of the polishing composition of the present invention is 6 or less. When the pH value exceeds 6, the positive charge on a surface of an object to be polished such as silicon nitride becomes small, therefore, it becomes difficult to polish an object to be polished at a high speed using the abrasive grains (sulfonic acid-modified colloidal silica) according to the present invention, of which the surfaces are negatively charged. From the viewpoint of polishing an object to be polished such as silicon nitride at a sufficient polishing rate by the polishing composition, the pH value of the polishing composition is preferably 5 or less, more preferably 4 or less, and particularly preferably 3 or less. From the viewpoint of the safety, the pH value of the polishing composition is preferably 1 or more, and more preferably 1.5 or more.

In order to adjust the pH of the polishing composition to a desired value, the polishing composition of the present invention may contain a pH adjusting agent. As the pH adjusting agent, the following acid, base, or a chelating agent can be used.

Examples of the acid include carboxylic acid such as formic acid, acetic acid, propionic acid, butyric acid, valeric acid, caproic acid, enanthic acid, caprylic acid, pelargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, lactic acid, malic acid, citric acid, benzoic acid, phthalic acid, isophthalic acid, terephthalic acid, salicylic acid, gallic acid, mellitic acid, cinnamic acid, oxalic acid, malonic acid, succinic acid, glutaric acid, adipic acid, fumaric acid, maleic acid, aconitic acid, amino acid, and nitro carboxylic acid; and sulfonic acid such as methanesulfonic acid, ethanesulfonic acid, benzenesulfonic acid, p-toluenesulfonic acid, 10-camphorsulfonic acid, isethionic acid, and taurine. Further, examples of the acid also include inorganic acid such as carbonic acid, hydrochloric acid, nitric acid, phosphoric acid, hypophosphorous acid, phosphorous acid, phosphonic acid, sulfuric acid, boric acid, hydrofluoric acid, orthophosphoric acid, pyrophosphoric acid, polyphosphoric acid, metaphosphoric acid, and hexametaphosphoric acid.

Examples of the base include an amine such as an aliphatic amine, and an aromatic amine, an organic base such as quaternary ammonium hydroxide, a hydroxide of an alkali metal, such as potassium hydroxide, a hydroxide of an alkaline earth metal, and ammonia. Among them, potassium hydroxide or ammonia is preferred from the viewpoint of easy availability.

Further, instead of or in combination with the above-described acid, a salt such as an ammonium salt or an alkali metal salt of the acid may be used as a pH adjusting agent. In particular, when a weak acid and a strong base, a strong acid and a weak base, or a weak acid and a weak base are used in combination, the buffering action of pH can be expected, and further, when a strong acid and a strong base are used in combination, not only the pH but also the electric conductivity can be adjusted with a small amount.

Examples of the chelating agent include polyamine, polyphosphonic acid, polyamino carboxylic acid, and polyamino phosphonic acid.

These pH adjusting agents can also be used alone or by mixing two or more kinds thereof. Among these pH adjusting agents, an inorganic acid and a carboxylic acid are preferred.

The addition amount of the pH adjusting agent is not particularly limited, and may be appropriately selected so that the pH is within the above pH range.

[Dispersing Medium or Solvent]

The polishing composition of the present invention contains water. From the viewpoint of preventing other components of the polishing composition from being influenced by the impurities, it is preferred to use water with purity as high as possible. Specifically, pure water or ultrapure water in which impurity ions have been removed by an ion exchange resin and then foreign matters have been removed through a filter, or distilled water is preferred. Further, as a dispersing medium or a solvent, for the purpose of controlling the dispersibility and the like of other components of the polishing composition, an organic solvent and the like may further be contained.

[Other Components]

The polishing composition of the present invention may further contain as needed other components such as a complexing agent, a metal anticorrosive, an antiseptic agent, an antifungal agent, an oxidizing agent, a reducing agent, a surfactant, and a water-soluble polymer. Hereinafter, an oxidizing agent, an antiseptic agent, an antifungal agent, and a water-soluble polymer will be described.

[Oxidizing Agent]

The oxidizing agent capable of being added into the polishing composition has an action of oxidizing the surface of an object to be polished, and improves the polishing rate for the object to be polished with the polishing composition.

Examples of the usable oxidizing agent include hydrogen peroxide, sodium peroxide, barium peroxide, an organic oxidizing agent, ozone water, a silver (II) salt, an iron (III) salt, permanganic acid, chromic acid, bichromic acid, peroxodisulfuric acid, peroxophosphoric acid, peroxosulfuric acid, peroxoboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, persulfuric acid, and dichloroisocyanuric acid; and salts thereof. These oxidizing agents may be used alone or by mixing two or more kinds thereof. Among them, hydrogen peroxide, ammonium persulfate, periodic acid, hypochlorous acid, and sodium dichloroisocyanurate are preferred.

The content of the oxidizing agent in the polishing composition is preferably 0.1 g/L or more, more preferably 1 g/L or more, and furthermore preferably 3 g/L or more. As the content of the oxidizing agent increases, the polishing rate for an object to be polished with the polishing composition is more improved.

Further, the content of the oxidizing agent in the polishing composition is preferably 200 g/L or less, more preferably 100 g/L or less, and furthermore preferably 40 g/L or less. As the content of the oxidizing agent decreases, the material cost of the polishing composition can be reduced, and further the load of the treatment of the polishing composition after use in polishing, that is, the load of the waste liquid treatment can also be reduced. In addition, the risk of excessive oxidation on the surface of an object to be polished by an oxidizing agent can also be reduced.

[Antiseptic Agent and Antifungal Agent]

Examples of the antiseptic agent and the antifungal agent, which can be added into the polishing composition according to the present invention, include an isothiazoline-based antiseptic agent such as 2-methyl-4-isothiazolin-3-one, and 5-chloro-2-methyl-4-isothiazolin-3-one; paraoxybenzoic acid esters and phenoxyethanol. These antiseptic agent and antifungal agent may also be used alone or by mixing two or more kinds thereof.

[Water-soluble Polymer]

In the polishing composition according to the present invention, for the purpose of improving the hydrophilicity on the surface of an object to be polished, or improving the dispersion stability of abrasive grains, a water-soluble polymer may be added. Examples of the water-soluble polymer include a cellulose derivative such as hydroxymethyl cellulose, hydroxyethyl cellulose (HEC), hydroxypropyl cellulose, hydroxyethyl methyl cellulose, hydroxypropyl methyl cellulose, methyl cellulose, ethyl cellulose, ethyl hydroxyethyl cellulose, and carboxymethyl cellulose; an imine derivative such as poly(N-acylalkyleneimine); polyvinyl alcohol; modified (cationic modified or nonionic modified) polyvinyl alcohol; polyvinyl pyrrolidone; polyvinyl caprolactam; and polyoxyalkylene such as polyoxyethylene; and copolymers containing these constituent units. These water-soluble polymer may be used alone, or may also be used by mixing two or more kinds thereof.

As described above, it is preferred that the polishing composition according to the present invention is used for an application of polishing silicon nitride. That is, it is preferred that the object to be polished contains essentially silicon nitride. Herein, an object to be polished may have a layer containing silicon nitride, and a layer containing a material different from silicon nitride. Examples of the material different from silicon nitride include polycrystalline silicon, monocrystalline silicon, tetraethyl orthosilicate (TEOS), and silicon oxide. These material may also be used alone or in combination of two or more kinds thereof. In addition, the layer containing a material different from silicon nitride, which is an object to be polished, may also have a single layer structure, or a multilayer structure of two or more kinds thereof. In a case of a multilayer structure, each layer may contain the same materials, or different materials. Further, the polishing composition according to the present invention can polish silicon nitride at a high speed, but for polycrystalline silicon, the polishing composition may be the one that does not polish the polycrystalline silicon at a high speed. Such a performance is sometimes required in a case of using a polishing composition for an application of polishing the surface of the object to be polished containing not only silicon nitride but also polycrystalline silicon. In this case, the ratio of the polishing rate of silicon nitride to the polishing rate of polycrystalline silicon is preferably 2 or more, more preferably 4 or more, furthermore preferably 6 or more, and particularly preferably 8 or more.

[Polishing Method Using Polishing Composition]

As described above, the polishing composition according to the present invention is suitably used for polishing silicon nitride. Therefore, according to further another embodiment of the present invention, a polishing method including a step of polishing silicon nitride using the polishing composition according to the present invention is provided. Further, according to further another embodiment of the present invention, a method for producing a substrate including a step of polishing silicon nitride by the polishing method is also provided.

When polishing silicon nitride using the polishing composition according to the present invention, the apparatus and conditions used for ordinary metal polishing can be used. As a general polishing device, there are a one-side polishing device and a double side polishing device. In a one-side polishing device, a substrate is held by using a holder called a carrier, and while supplying a polishing composition from the above, one side of an object to be polished is polished by rotating a surface plate on which a polishing pad is attached to the surface opposite to the substrate while pressing the surface plate. At this time, the object to be polished is polished by the physical action due to the friction between the polishing pad and the polishing composition, and the object to be polished, and by the chemical action on the object to be polished from the polishing composition. As the polishing pad, a porous body such as nonwoven fabric, polyurethane, and swede can be used without any particular limitation. It is preferred that a polishing pad is processed so as to accumulate a polishing liquid.

As the polishing conditions in the polishing method according to the present invention, a polishing load, a rotation speed of a surface plate, a rotation speed of a carrier, a flow rate of a polishing composition, and a polishing time can be mentioned. These polishing conditions are not particularly limited, but for example, the polishing load is, per unit area of the substrate, preferably 0.1 psi or more to 10 psi or less, more preferably 0.5 psi or more to 8.0 psi or less, and furthermore preferably 1.0 psi or more to 6.0 psi or less. In general, as the load becomes higher, the frictional force by abrasive grains becomes higher and the mechanical working force is improved, therefore, the polishing rate increases. Within this range, a sufficient polishing rate is exerted, and occurrence of the damages of a substrate due to the application of load and the defects such as scratches on the surface can be suppressed. The rotation speed of a surface plate and the rotation speed of a carrier are preferably 10 to 500 rpm. The supply amount of the polishing composition may be a supply amount that covers the entire substrate of an object to be polished, and may be adjusted according to the conditions such as the size of the substrate.

In addition, the polishing composition according to the present invention may be a one-pack type, or may also be a multi-pack type including a two-pack type. Further, the polishing composition according to the present invention may be prepared by, for example, diluting the stock solution of the polishing composition with a diluent such as water by 10 times or more.

EXAMPLES

The present invention will be described in more detail using the following Examples and Comparative Examples. However, the technical scope of the present invention is not limited only to the following Examples.

Example 1

In a flask, 4080 g of methanol, 610 g of water, and 168 g of 29% by mass ammonia aqueous solution were mixed, the temperature of the resultant mixture was kept at 20° C., and into the mixture, a mixture of 135 g of methanol and 508 g of tetramethoxysilane (TMOS) was added dropwise over 25 minutes. After that, the resultant mixture was subjected to heat concentrated water replacement under a condition of pH 7 or more, and 1000 g of 19.5% by mass silica sol was obtained. It was confirmed by gas chromatography (the following condition 1) that the methanol concentration at that time was less than 1% by mass (lower than the detection limit).

(Condition 1: Measurement conditions for methanol concentration using gas chromatography)

Apparatus: Gas chromatography GC-14B (manufactured by Shimadzu Corporation)

Measurement: 4 μL of a sample is taken out using a 10 μL syringe and injected to the present apparatus. The methanol concentration is calculated from the amount of moisture and the amount of methanol, which are obtained in the measurement.

Figure 2:
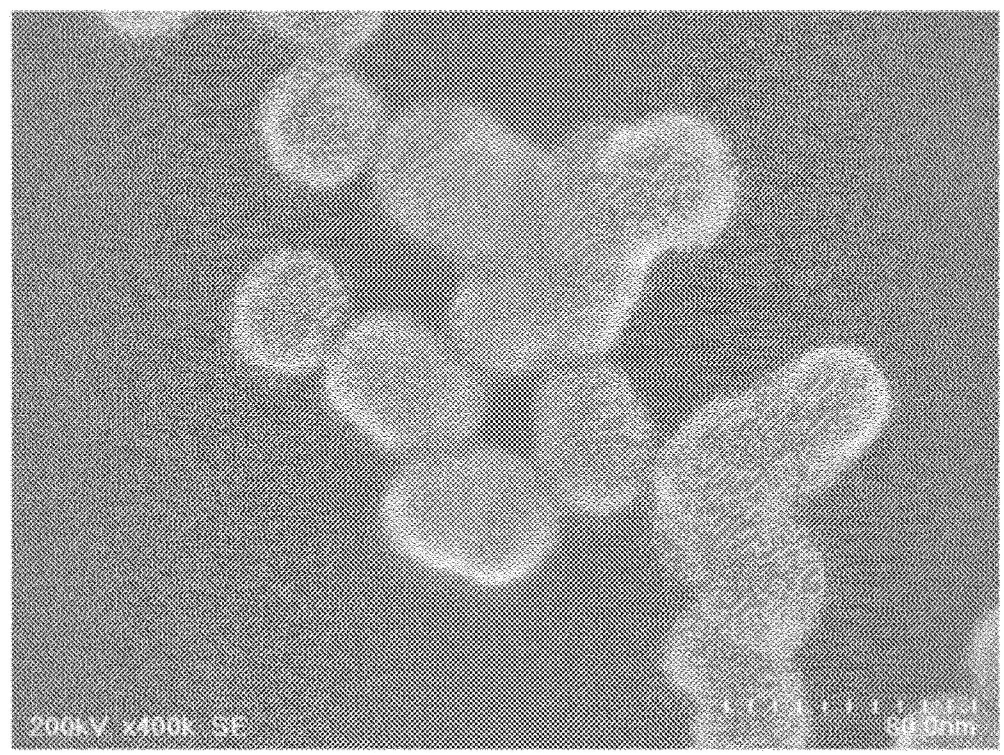
FIG. 2 is a photograph of sulfonic acid-modified aqueous anionic silica sol obtained in Example 1, observed with a transmission electron microscope (TEM) (magnification: 400000 times).

On the other hand, the silica sol obtained in the above was observed with a scanning electron microscope (SEM) (the following condition 2) (FIG. 1), and when the particle size distribution was analyzed by using image analysis software (the following condition 3) based on the SEM photograph, the number distribution ratio of the microparticles having a diameter of 40% or less of the volume average particle diameter by SEM image analysis was less than 1%. In addition, when the surface state of the silica particles was observed with a transmission electron microscope (TEM) (the following condition 4), the surface of the silica particles showed a smooth state (FIG. 2).

(Condition 2: Conditions for SEM Observation)

Apparatus: Scanning Electron Microscope S4700 (Manufactured by Hitachi High-Technologies Corporation)

Procedures: The one obtained by dispersing silica sol in an organic solvent and subjecting the resultant mixture to dry-solidifying on a sample table is placed in the main body, and irradiated with an electron beam at 12 kV by the present apparatus, and then ten viewing fields are observed at a magnification of 100000 times.

(Condition 3: Conditions for Image Analysis Based on SEM Photograph)

Apparatus: Image analysis software MacView Ver. 4 (manufactured by Mountech Co., Ltd.)

Procedures: Using the taken SEM photograph, 500 particles are counted by the present apparatus. After that, the volume average particle diameter based on Heywood diameter (equivalent circle diameter) was calculated, and the particle size distribution in terms of the proportion of the number of particles is calculated.

(Condition 4: Conditions for TEM Observation)

Apparatus: Transmission electron microscope HD-2700 (manufactured by Hitachi High-Technologies Corporation)

Procedures: Silica sol is dispersed in an organic solvent, the resultant mixture is added dropwise on a surface of dedicated Cu mesh and dry-solidified, the dry-solidified one is irradiated with an electron beam at 200 kV by the present apparatus, and then ten viewing fields are observed at a magnification of 400000 times.

Subsequently, into 1000 g of the silica sol obtained in the above, 1.7 g of 29% by mass ammonia water was charged to lower the viscosity, and into the resultant mixture, 2.5 g of 3-mercaptopropyl trimethoxysilane (product name: KBM-803, manufactured by Shin-Etsu Chemical Co., Ltd.) separately mixed with 22.5 g of methanol was added dropwise at a flow rate of 5 mL/min, and then the resultant mixture was heated, after the boiling, water replacement was performed for 6 hours. It was confirmed by the similar technique as in the above (gas chromatography method) that the methanol concentration at that time was a value outside the detection limit.

Next, the reaction mixture was once cooled down to 25° C., and then into the cooled mixture, 4.2 g of 31% by mass hydrogen peroxide water was charged, and the resultant mixture was boiled again. After the boiling, water replacement was performed for 4 hours, and then the resultant mixture was cooled down to room temperature, subsequently the sulfonic acid-modified aqueous anionic silica sol (pH=2.5) of the present Example was obtained as a polishing composition.

The amount of the impurities of 13 metal elements in the anionic silica sol thus obtained was measured with the metal impurity concentration measurement (the following condition 5) by an inductively coupled plasma (ICP) emission spectrometer, and in addition, the amount of the supernatant Si in the obtained anionic silica sol was measured with the supernatant Si concentration measurement (the following condition 6) by an inductively coupled plasma (ICP) emission spectrometer. Note that the supernatant Si concentration is a value obtained by measuring the supernatant, which has been obtained by centrifuging the anionic silica sol, by an inductively coupled plasma (ICP) emission spectrometer, and the fact that this value varies with time means that aggregation of microparticles and incorporation of microparticles to large particles are generated, and the physical properties are changed.

Further, a test of the SiN polishing rate was performed with a 300 mm CMP one-side polishing device (manufactured by Ebara Corporation) (the following condition 7).

In addition, an adhesion test on the SiN wafer was also performed, and the adhered wafer was observed by using a scanning electron microscope (manufactured by Hitachi High-Technologies Corporation) (the following condition 8). Further, the proportion of the number of small particles from the SEM photograph was analyzed (the above condition 3).

In addition, by the particle size distribution analysis from the SEM photograph with a scanning electron microscope (SEM), and by the surface shape observation at high magnification with a transmission electron microscope (TEM), the verification of the physical properties of the finished product was performed. From the results of the surface shape observation with TEM, changes in the surface characteristics of the silica particles were not observed even by performing the first and the second reaction steps.

(Condition 5: Conditions for Metal Impurity Concentration Measurement by ICP Emission Spectrometer)

Measuring Apparatus:

Ni and Cu: Agilent 7500cs ICP-MS (manufactured by Agilent Technologies, Inc.)

Ones other than Ni and Cu: ICPS-8100 (manufactured by Shimadzu Corporation)

Procedures: 10 ml of a sample is collected, into the collected sample, 3 ml of nitric acid and 10 ml of hydrofluoric acid are added, and the resultant mixture is evaporated and dry-solidified. After the dry-solidifying, 0.5 ml of nitric acid and around 20 ml of ultrapure water are added, and the resultant mixture is heated until steam is generated. The whole amount is recovered, adjusted to 50 g with ultrapure water, and measurements are performed by using each of the above apparatuses.

(Condition 6: Conditions for Supernatant Si Concentration Measurement by ICP Emission Spectrometer)

Centrifugal Device: High-Performance High-Speed Refrigerated Centrifuge, Avanti HP-30I (Manufactured by Beckman Coulter, Inc.)

ICP measuring apparatus: ICP-AES SPS3510 (manufactured by Hitachi High-Tech Science Corporation)

Procedures: Silica sol is placed in a dedicated resin tube, and centrifugation is performed at 26000 rpm for 2 hours. Subsequently, a calibration curve is drawn with Si standard samples of 0, 25, 50, and 75 ppm by ICP-AES, 1 g of the supernatant after the centrifugation is collected, and diluted with ultrapure water by 20 times, and then measurement is performed by the present apparatus.

(Condition 7: Test Conditions for SiN Polishing Rate by 300 mm CMP One-Side Polishing Device)

Apparatus: 300 mm CMP One-Side Polishing Device (manufactured by Ebara Corporation)

Polishing pad: polyurethane foam

Polishing wafer: 300 mm SiN bare wafer

Rotation speed: 60 rpm

Pressure: 70 hPa

Slurry flow rate: 300 mL/min

Polishing time: 60 sec

Polishing rate [Å/min]=Amount of the change in film thickness when polished for 1 minute The polishing rate is calculated by dividing each wafer thickness difference obtained by measuring before and after the polishing by using an optical interference-type film thickness measuring device by the polishing time.

(Condition 8: Adhesion Observation Test of SiN Wafer)

Apparatus: Scanning electron microscope SU 8000 (manufactured by Hitachi High-Technologies Corporation)

Procedures: The obtained modified colloidal silica is diluted to a silica concentration of 14% by mass and adjusted to pH 2 with a pH adjusting agent. A SiN wafer is immersed for 10 seconds, and then shaken in pure water for 30 seconds. Subsequently, the SiN wafer is dried thoroughly with $N_2$ gas, and then ten viewing fields are observed at a magnification of 100000 times using a scanning electron microscope SU 8000.

Comparative Example 1: Corresponding to Example 1 of JP 2010-269985 A

Into a mixture of 551.5 g of pure water, 550.2 g of 26% by mass ammonia water, and 9047 g of methanol in a flask, a mixture of 1065.5 g of tetramethoxysilane (TMOS), and 289.1 g of methanol was added dropwise over 55 minutes while maintaining the mixture temperature at 35° C., as a result of which silica sol containing water and methanol as a dispersing medium was obtained.

Figure 3:
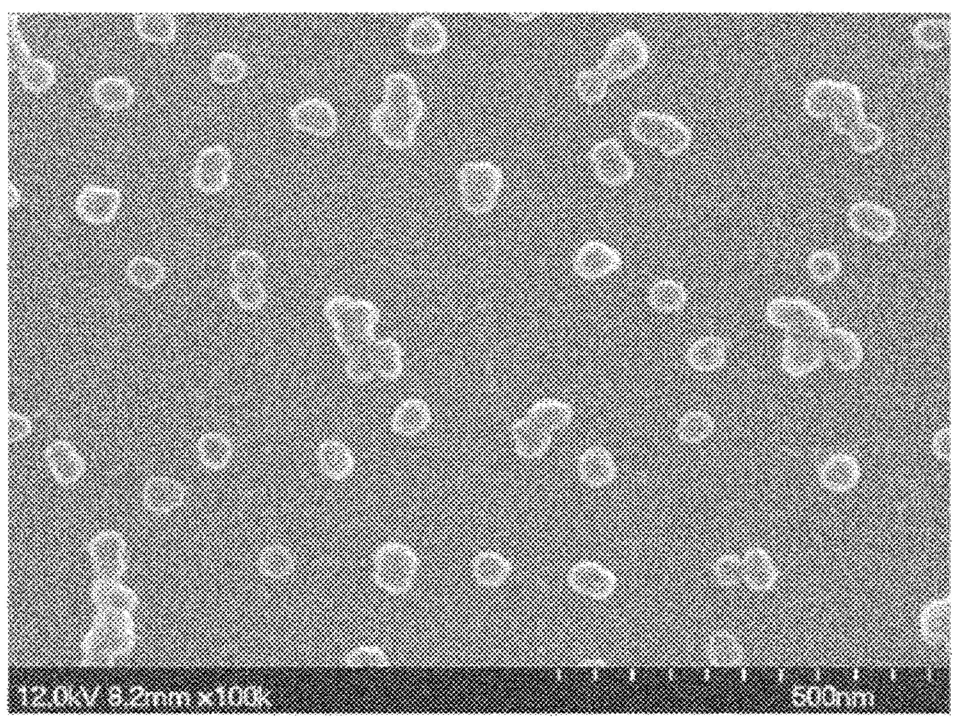
FIG. 3 is a photograph of sulfonic acid-modified aqueous anionic silica sol obtained in Comparative Example 1, observed with a scanning electron microscope (SEM) (magnification: 100000 times).
Figure 4:
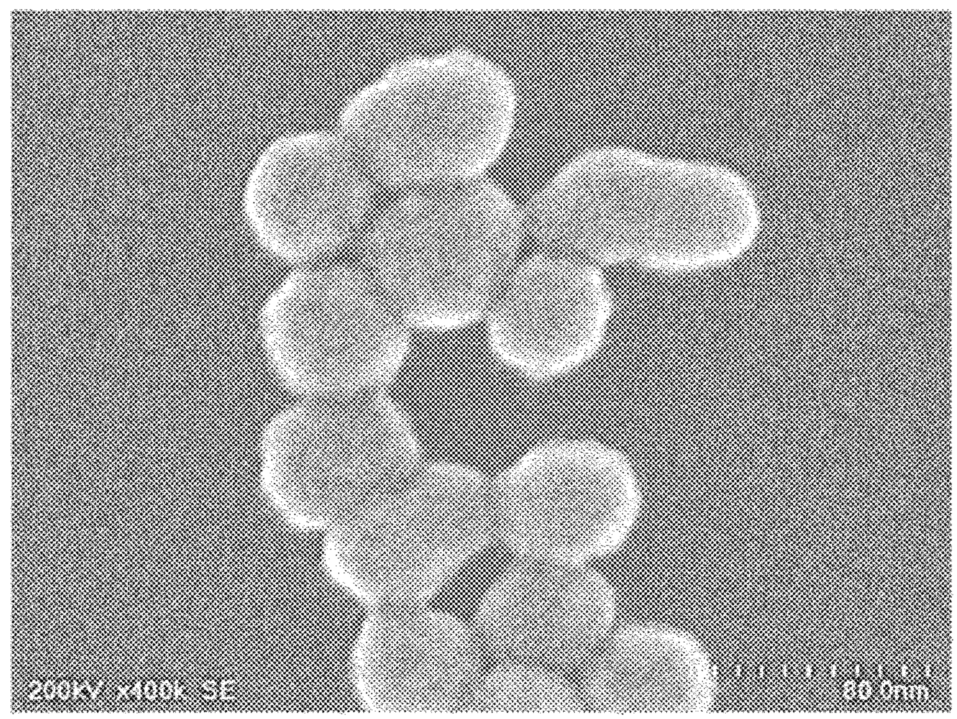
FIG. 4 is a photograph of sulfonic acid-modified aqueous anionic silica sol obtained in Comparative Example 1, observed with a transmission electron microscope (TEM) (magnification: 400000 times).

The silica sol obtained in the above was heated and concentrated to 3500 mL under normal pressure. When the methanol concentration of the mixture was measured in the similar manner as in the above, 71% by mass was obtained. Further, the silica sol obtained in the above was observed with a scanning electron microscope (SEM) in the similar manner as in the above (FIG. 3), and when the particle size distribution was analyzed by using image analysis software based on the SEM photograph, the number distribution ratio of the microparticles having a diameter of 40% or less of the volume average particle diameter by SEM image analysis was 47.6%. In addition, when the surface state of the silica particles was observed with a transmission electron microscope (TEM) in the similar manner as in the above, existence of an uneven state was confirmed on the surfaces of the silica particles (FIG. 4).

Subsequently, into 3500 mL of the silica sol obtained in the above, 4.2 g of 3-mercaptopropyl trimethoxysilane (product name: KBM-803, manufactured by Shin-Etsu Chemical Co., Ltd.) was added, and the resultant mixture was refluxed at a boiling point and heat-aged. After that, methanol and ammonia were replaced with water while adding pure water in order to keep the volume constant, and when the pH became 8 or less, the temperature of the silica sol was once lowered to room temperature. Next, into the resultant silica sol, 37.5 g of 35% by mass hydrogen peroxide water was added, and the resultant mixture was heated again, the reaction was continued for 8 hours, and the resultant mixture was cooled down to room temperature, subsequently the sulfonic acid-modified aqueous anionic silica sol (pH=6.5) of the present Comparative Example was obtained as a polishing composition.

As to the anionic silica sol thus obtained, in the similar manner as in the above, the amount of the impurities of 13 metal elements was measured with the metal impurity concentration measurement by an inductively coupled plasma (ICP) emission spectrometer, and in addition, the amount of the supernatant Si in the obtained anionic silica sol was measured with the supernatant Si concentration measurement by an inductively coupled plasma (ICP) emission spectrometer.

Further, in the similar manner as in the above, a test of the SiN polishing rate was performed with a 300 mm CMP one-side polishing device (manufactured by Ebara Corporation).

Subsequently, an adhesion test on the SiN wafer was also performed, and the adhered wafer was observed by using a scanning electron microscope (manufactured by Hitachi High-Technologies Corporation). Further, the proportion of the number of small particles from the SEM photograph was analyzed.

In addition, in the similar manner as in the above, by the particle size distribution analysis from the SEM photograph with a scanning electron microscope (SEM), and by the surface observation with a transmission electron microscope (TEM), the verification of the physical properties of the finished product was performed. From the results of the surface observation with TEM, changes in the surface characteristics of the silica particles were not observed even by performing the first and the second reaction steps.

Comparative Example 2

Figure 5:
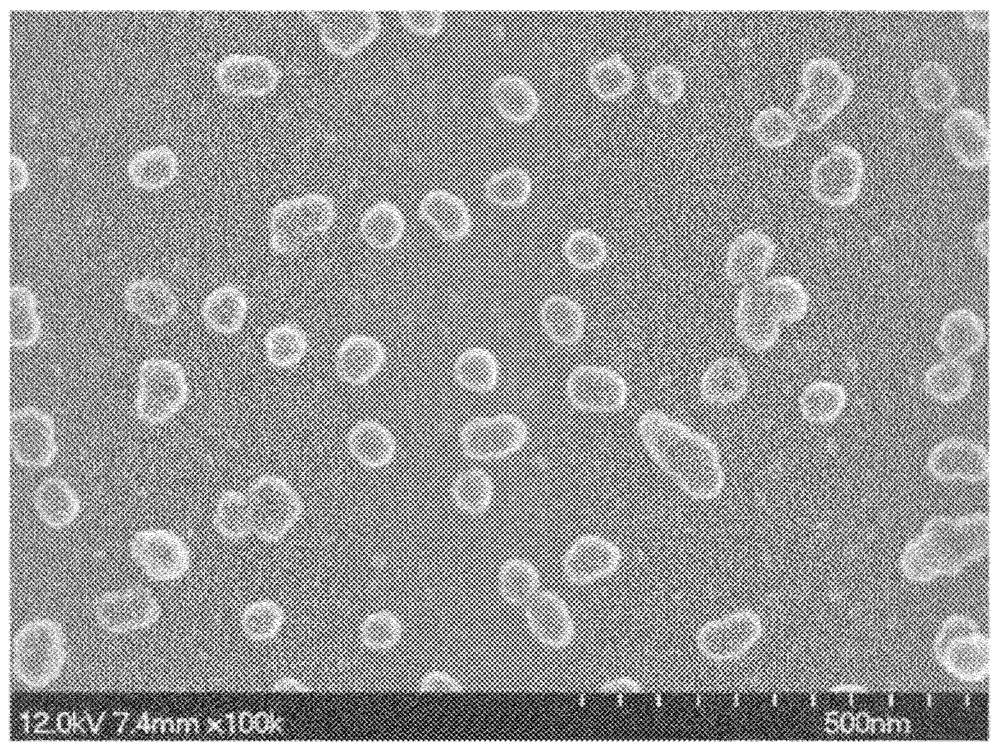
FIG. 5 is a photograph of sulfonic acid-modified aqueous anionic silica sol obtained in Comparative Example 2, observed with a scanning electron microscope (SEM) (magnification: 100000 times).
Figure 6:
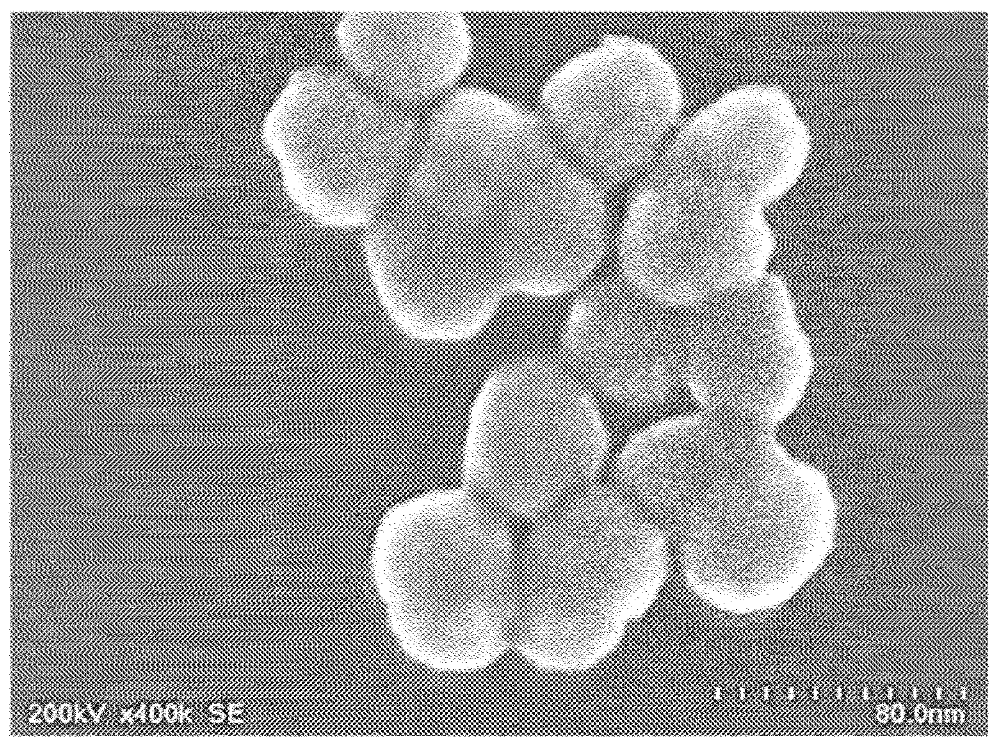
FIG. 6 is a photograph of sulfonic acid-modified aqueous anionic silica sol obtained in Comparative Example 2, observed with a transmission electron microscope (TEM) (magnification: 400000 times).

Into a mixture of 133 g of pure water, 64.8 g of 29% by mass ammonia water, and 1223 g of methanol, a mixture of 1015 g of tetramethoxysilane (TMOS) and 76 g of methanol, and 239 g of pure water were simultaneously added dropwise over 150 minutes while maintaining the mixture temperature at 35° C., as a result of which silica sol containing water and methanol as a dispersing medium was obtained. When the methanol concentration of the mixture was measured in the similar manner as in the above, 65% by mass was obtained. Further, the silica sol obtained in the above was observed with a scanning electron microscope (SEM) (FIG. 5), and when the particle size distribution was analyzed by using image analysis software based on the SEM photograph, the number distribution ratio of the microparticles having a diameter of 40% or less of the volume average particle diameter by SEM image analysis was 83.9%. In addition, when the surface state of the silica particles was observed with a transmission electron microscope (TEM) in the similar manner as in the above, existence of an uneven state was confirmed on the surfaces of the silica particles (FIG. 6).

Subsequently, into the silica sol obtained in the above (around 2000 g in terms of 19.5% by mass), 5.0 g of 3-mercaptopropyl trimethoxysilane (product name: KBM-803, manufactured by Shin-Etsu Chemical Co., Ltd.) mixed with 45.0 g of methanol was added dropwise at a flow rate of 5 mL/min, and then the resultant mixture was heated, methanol and ammonia were replaced with water while adding pure water in order to keep the volume constant, and when the pH became 8 or less, the temperature of the silica sol was once lowered to room temperature. After the resultant silica sol was cooled down to room temperature, into the cooled silica sol, 8.4 g of 31% by mass hydrogen peroxide water was charged, and the resultant mixture was boiled again. After the boiling, water replacement was performed for 4 hours, and then the resultant mixture was cooled down to room temperature, as a result of which the sulfonic acid-modified aqueous anionic silica sol (pH=6.5) of the present Comparative Example was obtained as a polishing composition.

The amount of supernatant Si in the anionic silica sol thus obtained was measured with the metal impurity concentration measurement by an ICP emission spectrometer in the similar manner as in the above, and further, in the similar manner as in the above, a test of the SiN polishing rate was performed with a 300 mm CMP one-side polishing device (manufactured by Ebara Corporation).

In addition, in the similar manner as in the above, by the particle size distribution analysis from the SEM photograph with a scanning electron microscope (SEM), and by the surface observation with a transmission electron microscope (TEM), the verification of the physical properties of the finished product was performed. From the results of the surface observation with TEM, changes in the surface characteristics of the silica particles were not observed even by performing the first and the second reaction steps.

TABLE 1

| | Physical properties of silica particles before addition of coupling agent | | Physical properties of silica particles after completion of anionic silica sol | | Immediately after production | | After high temperature acceleration test at 80° C. for 1 week | | |
|---|---|---|---|---|---|---|---|---|---|
| | Proportion of the number of microparticles [%] | Methanol concentration [% by mass] | Number distribution in SiN wafer adhesion [%] | Silica particle surface shape | Supernatant Si [ppm] | SiN polishing rate ratio [%] | Supernatant Si [ppm] | SiN polishing rate ratio [%] | Physical properties/ rate change |
| Example 1 | 0.17 | <1 (Not detected) | 0.15 | Smooth | 200 | 100 (Reference value) | 200 | 100 | No |
| Comparative Example 1 | 47.6 | 71 | 65.3 | Uneven | 700 | 104 | 400 | 92 | Yes |
| Comparative Example 2 | 83.9 | 65 | 88.2 | Uneven | 2000 | 92 | 1700 | 88 | Yes |

TABLE 2

| Unit: ppb by mass | Example 1 | Comparative Example 1 | Comparative Example 2 |
|---|---|---|---|
| Ni | 0.1 | 0.1 | 0.2 |
| Cu | <0.05 | <0.05 | <0.05 |
| Zn | <5 | <5 | <5 |
| Ag | <3 | <3 | <3 |
| Al | <5 | <5 | <5 |
| Ca | 2.1 | 1.9 | 1.7 |
| Cr | <5 | <5 | <5 |
| Fe | <10 | <10 | <10 |
| K | <55 | <55 | <55 |
| Mg | <3 | <3 | <3 |
| Na | 12.6 | 13.2 | 12.4 |
| Pb | <14 | <14 | <14 |
| Ti | <5 | <5 | <5 |

From the results shown in Table 1, the sulfonic acid-modified aqueous anionic silica sol contained in the polishing composition of Example 1, which had been produced by the production method according to the present invention, showed smooth surface shape of silica particles, and the amount of the microparticles adhering to the SiN wafer was largely reduced. In addition, the amount of the supernatant Si (depending on the amount of microparticles) contained in the obtained silica sol was also reduced, and further, the amount of supernatant Si did not change also with time. As a result, it was confirmed that the ratio of the SiN polishing rate of the polishing composition of Example 1 also does not change with time, and the polishing composition is excellent extremely in the stability with time.

On the other hand, the silica sol contained in the polishing composition produced by the production methods of Comparative Examples 1 and 2 had unevenness on the surfaces of the silica particles, and the amount of the microparticles adhered to the SiN wafer was also large. In addition, the amount of the supernatant Si contained in the obtained silica sol was also large, and further, the amount of supernatant Si changed with time. As a result, it was confirmed that the ratio of the SiN polishing rate of the polishing composition of Comparative Examples 1 to 2 also fluctuates largely with time, and the polishing composition is inferior in the stability with time.

Further, the measurement results of the above-described metal impurity amount are shown in the following Table 2.

From the results shown in Table 2, it can be understood that the sulfonic acid-modified aqueous anionic silica sol used for the polishing composition according to the present invention has an extremely small content of metal impurities.

This application is based on Japanese Patent Application No. 2015-008052, filed with the Japan Patent Office on Jan. 19, 2015, the entire content of which is hereby incorporated by reference.

The invention claimed is:

1. A method of producing a sulfonic acid-modified aqueous anionic silica sol obtained by immobilizing sulfonic acid on surfaces of silica particles comprising:

a first reaction step comprising obtaining a reactant by heating raw colloidal silica having a number distribution ratio of 10% or less of microparticles having a particle diameter of 40% or less relative to a volume average particle diameter based on Heywood diameter (equivalent circle diameter) as determined by image analysis using a scanning electron microscope in the presence of a silane coupling agent having a functional group chemically convertible to a sulfonic acid group; and a second reaction step comprising converting the functional group to a sulfonic acid group by treating the reactant, wherein the method further comprises distilling off an organic solvent coexisting with colloidal silica under a condition of pH 7 or more so that a residual organic solvent concentration in colloidal silica having an organic solvent concentration of 1% by mass or more becomes less than 1% by mass to obtain the raw colloidal silica.

2. The method of claim 1, wherein the functional group is a mercapto group.

3. The method of claim 2, wherein the treatment is an oxidation treatment using hydrogen peroxide.

4. The method of claim 3, wherein an addition amount of the hydrogen peroxide is 3 to 5 mol times relative to an addition amount of the silane coupling agent, and a residual hydrogen peroxide concentration in the obtained aqueous anionic silica sol is 500 ppm by mass or less.

5. A method of producing a polishing composition having a pH of 6 or less comprising mixing the sulfonic acid-modified silica sol of claim 1 and water.

6. The method of claim 5, wherein the polishing composition is suitable for an application of polishing silicon nitride.

7. The method of claim 1, wherein the total content of metal impurities in the sulfonic acid-modified aqueous anionic silica is 1 ppm by mass or less.

8. A method of producing a sulfonic acid-modified aqueous anionic silica sol obtained by immobilizing sulfonic acid on surfaces of silica particles comprising:

a first reaction step comprising obtaining a reactant by heating raw colloidal silica having a number distribution ratio of 10% or less of microparticles having a particle diameter of 40% or less relative to a volume average particle diameter based on Heywood diameter (equivalent circle diameter) as determined by image analysis using a scanning electron microscope in the presence of a silane coupling agent having a functional group chemically convertible to a sulfonic acid group; and a second reaction step comprising converting the functional group to a sulfonic acid group by treating the reactant, wherein the method further comprises lowering a viscosity of the raw colloidal silica by adding an alkaline solution or an organic solvent to the raw colloidal silica before the first reaction step.

9. The method of claim 8, wherein the method further comprises distilling off an organic solvent coexisting with colloidal silica under a condition of pH 7 or more so that a residual organic solvent concentration in colloidal silica having an organic solvent concentration of 1% by mass or more becomes less than 1% by mass to obtain the raw colloidal silica.

10. The method of claim 8, wherein the functional group is a mercapto group.

11. The method of claim 10, wherein the treatment is an oxidation treatment using hydrogen peroxide.

12. The method of claim 11, wherein an addition amount of the hydrogen peroxide is 3 to 5 mol times relative to an addition amount of the silane coupling agent, and a residual hydrogen peroxide concentration in the obtained aqueous anionic silica sol is 500 ppm by mass or less.

13. The method of claim 8, wherein in the production method, the first reaction step is performed under a condition that a temperature condition of 90° C. or more is continued for 30 minutes or more.

14. A method of producing a polishing composition having a pH of 6 or less comprising mixing the sulfonic acid-modified silica sol of claim 8 and water.

15. The method of claim 14, wherein the polishing composition is suitable for an application of polishing silicon nitride.

16. The method of claim 8, wherein the total content of metal impurities in the sulfonic acid-modified aqueous anionic silica is 1 ppm by mass or less.

17. A method of producing a sulfonic acid-modified aqueous anionic silica sol obtained by immobilizing sulfonic acid on surfaces of silica particles comprising:

a first reaction step comprising obtaining a reactant by heating raw colloidal silica having a number distribution ratio of 10% or less of microparticles having a particle diameter of 40% or less relative to a volume average particle diameter based on Heywood diameter (equivalent circle diameter) as determined by image analysis using a scanning electron microscope in the presence of a silane coupling agent having a functional group chemically convertible to a sulfonic acid group; and a second reaction step comprising converting the functional group to a sulfonic acid group by treating the reactant, wherein in the production method, the first reaction step is performed under a condition that a temperature condition of 90° C. or more is continued for 30 minutes or more.

18. The method of claim 17, wherein the method further comprises distilling off an organic solvent coexisting with colloidal silica under a condition of pH 7 or more so that a residual organic solvent concentration in colloidal silica having an organic solvent concentration of 1% by mass or more becomes less than 1% by mass to obtain the raw colloidal silica.

19. The method of claim 17, wherein the functional group is a mercapto group.

20. The method of claim 19, wherein the treatment is an oxidation treatment using hydrogen peroxide.

21. The method of claim 20, wherein an addition amount of the hydrogen peroxide is 3 to 5 mol times relative to an addition amount of the silane coupling agent, and a residual hydrogen peroxide concentration in the obtained aqueous anionic silica sol is 500 ppm by mass or less.

22. A method of producing a polishing composition having a pH of 6 or less comprising mixing the sulfonic acid-modified silica sol of claim 17 and water.

23. The method of claim 22, wherein the polishing composition is suitable for an application of polishing silicon nitride.

24. The method of claim 17, wherein the total content of metal impurities in the sulfonic acid-modified aqueous anionic silica is 1 ppm by mass or less.

* * * * *